US010332591B2

(12) United States Patent
Huott et al.

(10) Patent No.: US 10,332,591 B2
(45) Date of Patent: *Jun. 25, 2019

(54) SRAM MARGIN RECOVERY DURING BURN-IN

(71) Applicant: International Business Machines Corporation, Armonk, NY (US)

(72) Inventors: William V. Huott, Holmes, NY (US); Chandrasekharan Kothandaraman, New York, NY (US); Adam J. McPadden, Underhill, VT (US); Uma Srinivasan, Poughkeepsie, NY (US); Stephen Wu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/902,065

(22) Filed: Feb. 22, 2018

(65) Prior Publication Data

US 2018/0322917 A1 Nov. 8, 2018

Related U.S. Application Data

(63) Continuation of application No. 15/589,071, filed on May 8, 2017.

(51) Int. Cl.
*G11C 11/419* (2006.01)
*G11C 29/12* (2006.01)
*G11C 29/50* (2006.01)

(52) U.S. Cl.
CPC ............ *G11C 11/419* (2013.01); *G11C 29/12* (2013.01); *G11C 29/50* (2013.01)

(58) Field of Classification Search
CPC ........ G11C 11/419; G11C 29/12; G11C 29/50
See application file for complete search history.

(56) References Cited

U.S. PATENT DOCUMENTS

| 5,956,279 | A  | 9/1999 | Mo et al. |
| 6,552,941 | B2 | 4/2003 | Wong et al. |
| 6,804,136 | B2 | 10/2004 | Forbes |
| 7,099,224 | B2 | 8/2006 | Chou |
| 7,679,978 | B1 | 3/2010 | Su et al. |
| 7,735,046 | B2 | 6/2010 | Arsovski |
| 7,880,238 | B2 | 2/2011 | Liang et al. |
| 9,059,204 | B2 | 6/2015 | Feng et al. |

(Continued)

OTHER PUBLICATIONS

Wang et al., Improving SRAM Vmin and Yield by Using Variation-Aware BTI Stress, 2010 IEEE, 4pages.*

(Continued)

*Primary Examiner* — Sung Cho
(74) *Attorney, Agent, or Firm* — A. Imtiaz Billah; Brian M. Restauro

(57) ABSTRACT

Embodiments of the present invention provide systems and methods for re-balancing the stability of a SRAM cell. Embodiments of the present invention identify SRAM cells with negative voltage threshold margins and write a "zero" state bit with in the bi-stable flip-flop of the SRAM. Raising the voltage of the CMOS set containing the "zero" state bit and selective transistor biasing, skews the "zero" state bit towards the complementary "one" state bit. This induces an increase voltage thresholds of the identified SRAM cells.

1 Claim, 6 Drawing Sheets

(56) References Cited

U.S. PATENT DOCUMENTS

| | | | |
|---|---|---|---|
| 9,136,019 B1* | 9/2015 | Alves | G11C 29/08 |
| 9,590,626 B1 | 3/2017 | Pedersen | |
| 2003/0043677 A1* | 3/2003 | Marr | G11C 5/14 |
| | | | 365/226 |
| 2006/0262628 A1* | 11/2006 | Nii | G11C 5/063 |
| | | | 365/226 |
| 2007/0211517 A1* | 9/2007 | Burnett | G11C 11/419 |
| | | | 365/154 |
| 2009/0190413 A1* | 7/2009 | Hsu | G11C 11/412 |
| | | | 365/189.09 |
| 2009/0290439 A1* | 11/2009 | Chang | G11C 11/412 |
| | | | 365/189.15 |
| 2010/0202192 A1* | 8/2010 | Elvira Villagra | G11C 11/413 |
| | | | 365/154 |
| 2011/0267914 A1* | 11/2011 | Ishikura | G11C 7/06 |
| | | | 365/208 |
| 2011/0299349 A1* | 12/2011 | Deng | G11C 29/50 |
| | | | 365/201 |
| 2013/0003442 A1 | 1/2013 | Asthana | |
| 2013/0016573 A1 | 1/2013 | Goel | |
| 2013/0019132 A1* | 1/2013 | Amirkhanyan | G11C 29/08 |
| | | | 714/721 |
| 2013/0021864 A1 | 1/2013 | Deng et al. | |
| 2013/0163357 A1* | 6/2013 | Buer | G11C 8/08 |
| | | | 365/201 |
| 2014/0204687 A1 | 7/2014 | Sinangil | |
| 2015/0179653 A1* | 6/2015 | Wang | H01L 27/1104 |
| | | | 257/369 |
| 2015/0228357 A1* | 8/2015 | Arsovski | G11C 11/419 |
| | | | 365/154 |
| 2016/0027738 A1 | 1/2016 | Murray et al. | |
| 2016/0049191 A1* | 2/2016 | Siddiqui | G11C 11/419 |
| | | | 365/154 |
| 2016/0064069 A1* | 3/2016 | Menezes | G11C 11/419 |
| | | | 365/156 |
| 2016/0093365 A1* | 3/2016 | Song | G11C 11/419 |
| | | | 365/154 |
| 2016/0204781 A1* | 7/2016 | Plusquellic | H03K 19/00323 |
| | | | 326/8 |
| 2016/0247554 A1* | 8/2016 | Mojumder | G11C 11/419 |
| 2017/0048072 A1* | 2/2017 | Cambou | H04L 9/3278 |
| 2017/0067830 A1* | 3/2017 | Adell | G01N 21/6489 |
| 2017/0309719 A1 | 10/2017 | Sun et al. | |

OTHER PUBLICATIONS

Cakir et al., "6T SRAM and 3T DRAM Data Retention and Remanence Characterization in 65nm bulk CMOS", 978-1-4673-1556-2/12 @2012 IEEE, 4 pages.

Cartier et al., "Characterization and Optimization of Charge Trapping in High-k Dielectrics", 978-1-4799-0113-5/13 © 2013 IEEE, 5A.2.1-5A.2.7, 7 pages.

Kothandaraman et al., "Oxygen vacancy traps in Hi-K/Metal gate technologies and their potential for embedded memory applications", 978-1-4673-7362-3/15 © 2015 IEEE, MY.2.1-MY.2.4, 4 pages.

Wang et al., "Product Burn-in Stress Impacts on SRAM Array Performance", 1-4244-0919-5/07 © 2007 IEEE, IEEE 07CH37867 45th Annual International Reliability, Physics Symposium, Phoenix, 2007, pp. 666-667.

Wang et al., Improving SRAM Vmin and Yield by Using Variation-Aware BTI Stress, 201 O IEEE.

Houtt et al., "SRAM Margin Recovery During Burn-In", U.S. Appl. No. 15/589,071, filed May 8, 2017, 20 pages.

Houtt et al., "SRAM Margin Recovery During Burn-In", U.S. Appl. No. 15/826,990, filed Nov. 30, 2017, 17 pages.

Appendix P—List of IBM Patents or Patent Applications Treated as Related, Filed herewith, 2 Pages.

* cited by examiner

SRAM MARGIN RECOVERY DURING BURN-IN

BACKGROUND

The present invention relates generally to array circuit designs, and more specifically to improving margins of the array circuit.

Complimentary metal-oxide semiconductor field-effect transistor (CMOS) technology is becoming increasingly miniaturized. This leads to complexities in designing static random access memory (SRAM). SRAM contains one or more arrays, wherein each array is a data structure composed of a collection of elements (e.g., values or variables) identified by at least one array index or key. During a write operation, the SRAM cell must flip in order to write new data in the cell. During a read operation, the SRAM cell must not flip in order to prevent data loss. There is only a certain area on the SRAM cell where reliable read and write operations are possible. Degradative processes, such as bias temperature instability (BTI), weaken n-type metal-oxide semiconductor (NMOS) field-effect transistors (FETs) and p-type metal-oxide semiconductor (PMOS) FETs. The SRAM cell stores bits (i.e., a basic unit of information in computing) as data storage elements using bi-stable latching circuitry. The bi-stable latching circuitry, which contain NMOS FETs and PMOS FETs, stores state information on each bit. The binary nature of these bits is represented in terms of two states—"zero" or "one." In other words, each bit is in the "zero" state or the "one" state.

SUMMARY

According to one embodiment of the present invention, a first for re-balancing memory cell stability is provided. The method comprises: empirically testing for a digital state of a plurality of cells within an array of static random access memory (SRAM) to determine unbalanced cell bias; determining which cells within the array of SRAM which fail to hold a certain bit pattern; and responsive determining which cells within the array of SRAM fail to hold a certain bit pattern, switching a state of a bit, wherein the bit resides in a negative margin cell among the plurality of cells within the array of SRAM, wherein the bit is either in a zero state or a one state, and wherein the negative margin cell fails to hold the certain bit pattern.

Another embodiment of the present invention provides an apparatus for re-balancing memory cell stability, based on the method described above.

DETAILED DESCRIPTION

The "zero" and "one" states are associated with a signal, wherein the signal elicits a voltage. The elicited voltage is associated with a margin. For example, the read margin applies to a read input while write margin applies to a write input. The margin is the difference between the elicited voltage and the threshold for a proper "zero" or "one". For example, a circuit is designed to have a voltage between 0.0 volts to 1.2 volts (V). A voltage below 0.2 V is considered a proper "zero" and a voltage above 1.0 V is considered a proper "one". Positive margins are indicative of proper operations while negative margins are indicative of compromised or failed operations. Some SRAM cells, within an array, have negative margins due to a voltage threshold ($V_{th}$) mismatch in a specific cell, wherein $V_{th}$ is the minimum gate-to-source voltage differential needed to create a conduction path between the source and drain terminals of FETs. Embodiments of the present invention disclose solutions which improve the margin (i.e., decrease the magnitude of negative margins) for the whole array by a targeted shift in $V_{th}$ of an individual SRAM cell. More specifically, the solution in applied to SRAM cells holding the "one" state (or the complementary "zero" state) and when a set of FETs is in the BTI mode. Subsequently, a high K or metal gate dielectric contains vacancies which: (i) trap electrons; (ii) shift the $V_{th}$ of FETs; and (iii) increase $V_{th}$ of FETs to balance out the voltage of SRAM cells which do not have balanced voltages.

Figure 1:
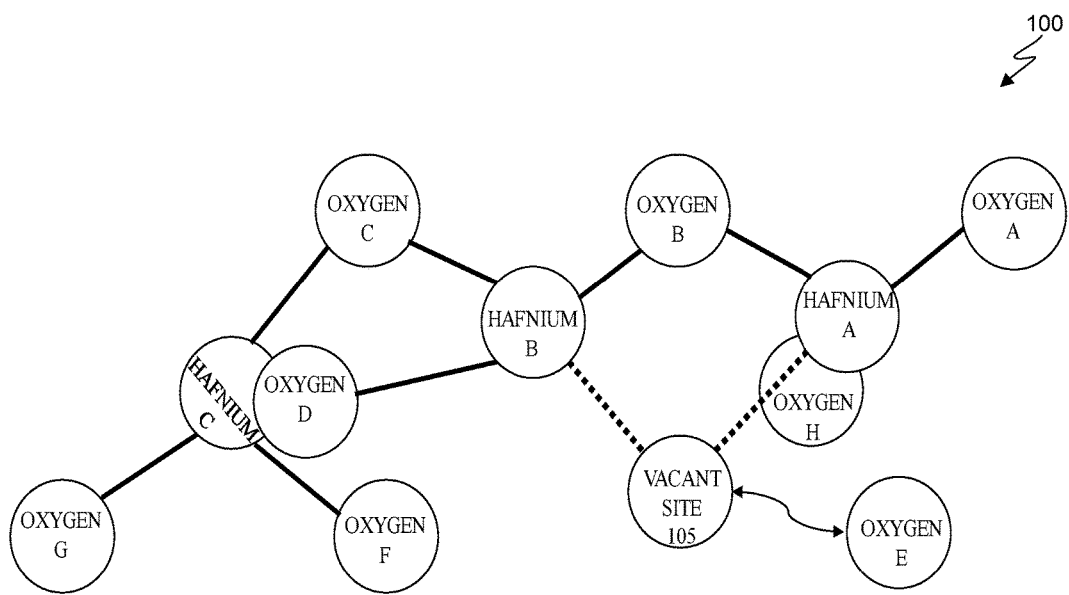
FIG. 1 is a diagram of an environment comprising a hafnium (IV) oxide based gate dielectric, in accordance with an embodiment of the present invention.

The present invention will now be described in detail with reference to the Figures. FIG. 1 is a diagram of environment 100 comprising a hafnium (IV) oxide based gate dielectric, in accordance with an embodiment of the present invention. FIG. 1 provides only an illustration of implementation of electronic component devices used in a computing environment and does not imply any limitations with regard to the environments in which different embodiments may be implemented.

Environment 100 depicts a crystalline hafnium(IV) oxide structure.

Hafnium(IV) oxide is an inorganic compound with the formula of $HfO_2$. Hafnium (IV) oxide is an electrical insulator with a band gap of 5.3-5.7 electronvolts (eV). Materials with a large band gap are able to prevent/limit the movement of charge carriers (e.g., electrons or holes) and thus, limit conduction and increase electrical insulation. This is considered to be a large band gap and thus, hafnium (IV) oxide is used as an insulating material. The gate insulator of FETs often utilize silicon dioxide. However, hafnium (IV) oxide is being increasingly utilized as the gate insulators of these FETs. The dielectric constant for hafnium (IV) oxide is four times higher than that of silicon dioxide, wherein the dielectric constant is the ratio of capacitance of a material in a dielectric to capacitance under vacuum conditions. Capacitance is the ability to store charge and a dielectric is an electrical insulator which can be polarized by an applied electric field. Higher capacitances are indicative of materials which are not as effective at conducting in comparison to materials with lower capacitances. In response to applied electric fields, electrical charges are not as mobile in dielectric materials in comparison to conducting materials. Thus, dielectrics are considered poor conductors of electricity.

Deposition methods, composition, and microstructure of hafnium (IV) oxide influence the dielectric properties of hafnium (IV) oxide. Furthermore, the microstructure of hafnium (IV) oxide influences voltage observed in NMOS FETs and PMOS FETs.

The crystalline structure in environment 100 depicts a defect in the hafnium (IV) oxide structure. The straight solid lines depict two atoms being bound together through chemical bonds and covalent interactions. Covalent interactions between two atoms occur at longer distances than a chemical bond. Thus, chemical bonds are energetically stronger than covalent interactions. The hafnium atom, a depicted in environment 100, is a tetra-cationic species and the oxygen atom is a di-anionic species. The hafnium atoms, as depicted in environment 100, are 7-coordinate centers while the oxygen atoms are 3-coordinate centers. In other words, a 7-coordinate hafnium atom exhibits 7 instances of either forming a chemical bond to or covalently interacting with an oxygen atom while a 3-coordinate oxygen atom exhibits 3 instances of either forming a chemical bond to or covalent interacting with a hafnium atom. Hafnium A is a hafnium atom bound to the following oxygen atoms—oxygens A, B, and D. The bond from oxygen D to hafnium A is not depicted explicitly in FIG. 1 Hafnium B is a hafnium atom bound to oxygen atoms to the following oxygen atoms— oxygens B, C, and D. Hafnium C is bound to the following oxygen atoms—oxygens C, D, G, and F. Not all of the atoms to which the hafnium atoms and oxygen atoms are bound to are depicted. The straight dotted lines to the vacant site (e.g., vacant site 105) are indicative of a space within the crystal structure which previously held an oxygen atom. This previously held oxygen atom is released. In an exemplary embodiment, oxygen E previously occupied the space associated with the vacant site. The vacant site is connected to hafnium A and hafnium B, which is indicative of oxygen E previously being bound to hafnium A and hafnium B. The vacant site will be referred to as an oxygen vacancy herein. In other dielectrics, other types of atomic vacancies (i.e., a site which previously held an atom besides oxygen) are possible without departing from the scope of the claims of this disclosure. These oxygen vacancies have a low formation energy, suggesting that the formation of these oxygen vacancies is an energetically favorable process (e.g., the Gibbs free energy of formation is negative). Furthermore, the activation energy of the process to create the oxygen vacancy may be relatively low in comparison to other processes and thus, this process occurs readily (i.e., the rate of reaction to create oxygen vacancies is high). Higher activation energies are indicative of processes which occur at lower rate of reaction than processes with lower activation energies. The oxygen vacancies are neutral in charge, however they are capable of being ionized by trapping charge carriers (e.g., electrons or holes). Electrons are negatively charged carriers and thus, the trapping of electrons furnishes negatively ionized oxygen vacancies. Holes are positively charged carriers, and thus the trapping of holes furnishes positively ionized oxygen vacancies.

Figure 2:
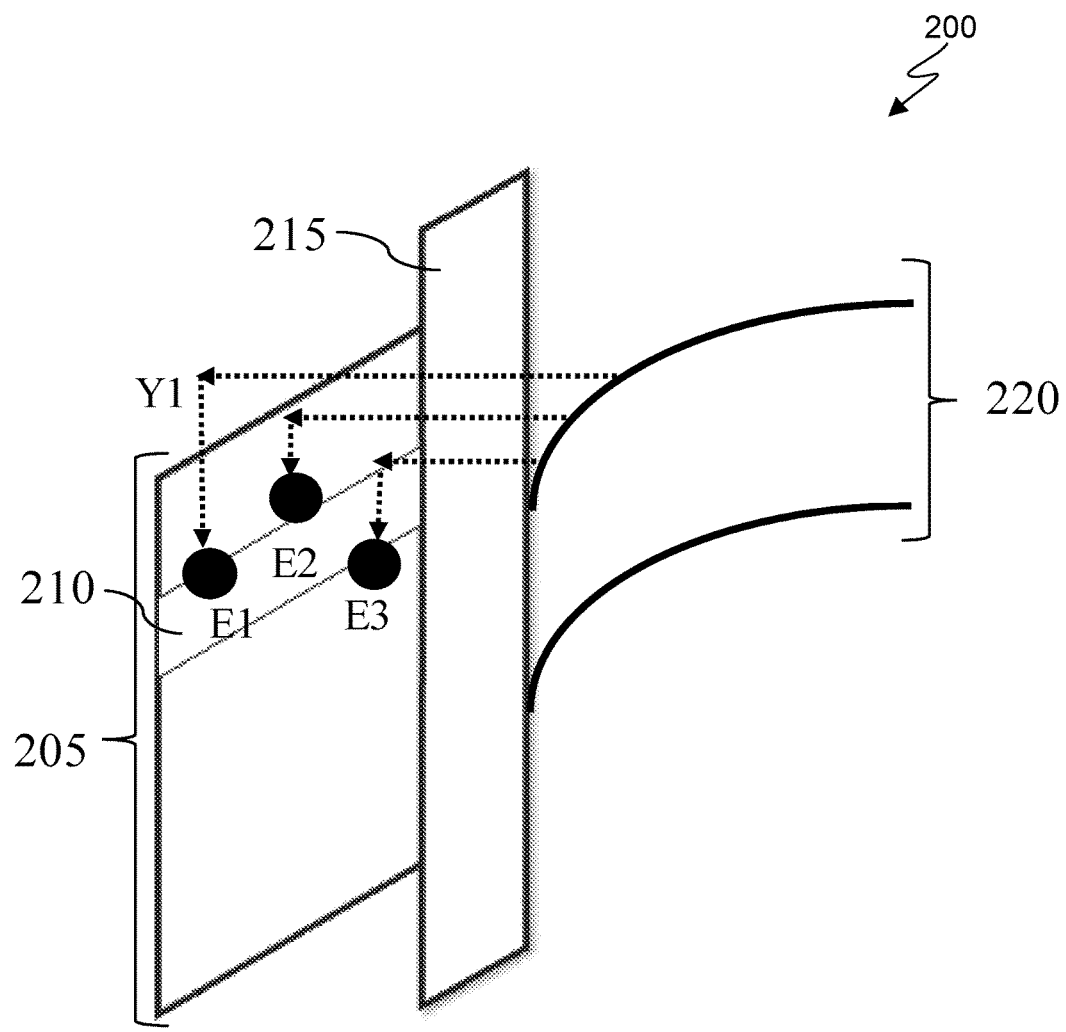
FIG. 2 is a diagram of electron traps within a hafnium(IV) oxide structure, in accordance with an embodiment of the present invention.

FIG. 2 is a cross section view of electron traps within a hafnium(IV) oxide structure, in accordance with an embodiment of the present invention.

FET 200 is a section of a FET. This section contains a silicon surface (e.g., Si 220); an interfacial layer (e.g., IL 215); a dielectric surface (e.g., hafnium(IV) oxide surface 205 (HOS 205)); and an oxygen vacancy (e.g., electron trap 210) within the dielectric surface.

A FET contains p-type or n-type doped silicon (Si). P-type dopants are positive charge carriers (e.g., electron deficient species relative to silicon). P-type dopants are able to increase the flow of electrical charge and voltage by creating energy states near the valence band. In contrast, n-type dopants are able to increase the flow of electrical charge and voltage by creating energy states near the conduction band. In an exemplary embodiment, FET 200 is a NMOS-FET and thus, Si 220 is a silicon surface containing trace impurities of p-type dopants. A Si atom in the crystal lattice of Si 220 is replaced with a p-type dopant, such as boron. Boron has three valence electrons in comparison to silicon's four valence electrons. Thus, boron (B) is relatively electron deficient in comparison to silicon. The replaced Si had four valence electrons and four accompanying bonds. The replacing B has three valence electrons and three accompanying bonds, which leads to an unoccupied/vacant site in the crystal lattice of Si 220. The unoccupied site attracts electrons from a neighboring site and thus, furnish a hole (i.e., electron deficiency) in the neighboring site. The furnished hole attracts an electrons from a neighboring site, which in turn furnishes a hole in another neighboring site. This process continues in a chain-like fashion, rendering the hole as: (i) a mobile species within the crystal lattice of Si 220; and (ii) a charge carrier species. Summarily, the p-type dopant (e.g., as in boron in this exemplary embodiment) is behaving as an "electron acceptor" and "valence band", with respect to molecular orbital and band gap theory. More specifically, the junction, where Si 220 and IL 215 intersect, may behave as an electron acceptor and valence band upon receiving a voltage. (The voltage supply pin is not shown in FIG. 2.)

IL 215 acts an interface between the surface of Si 220 and HOS 205. IL 215 is a thin structure which may be composed of oxides. In order to facilitate the movement of electrons within FET 200, the electron acceptor entity requires an electron donor. Similarly, the valence band entity requires a conduction band. In this exemplary embodiment, where FET 200 is a NMOS FET, IL 215 obtains electrons from Si 220 and these obtained electrons are transferred to electron trap 210 within HOS 205. More specifically, the electrons at the junction, where Si 220 and IL 215 intersect, are sent to electron trap 210. In other words, the junction, where Si 220 and IL 215 intersect, may also behave as an electron donor and conduction band upon receiving a voltage.

In the exemplary embodiment, where FET 200 is a NMOS FET, HOS 205 contains an oxygen vacancy, wherein the oxygen vacancy is electron trap 210. The trapped electrons are depicted as darkened circles and labeled as E1, E2, and E3. Electron trap 210 facilitates the capturing and tunneling of E1, E2, and E3 from the conduction band in silicon. It is energetically favorable for the free electrons (e.g., E1, E2, and E3) in the conduction band to be captured by the vacancy states. The trapping of electrons in E1, E2, and E3 alters the local electric field, which in turn increases the $V_{th}$ of a NMOS FET. The voltage shifts are described in more detail below.

Figure 3:
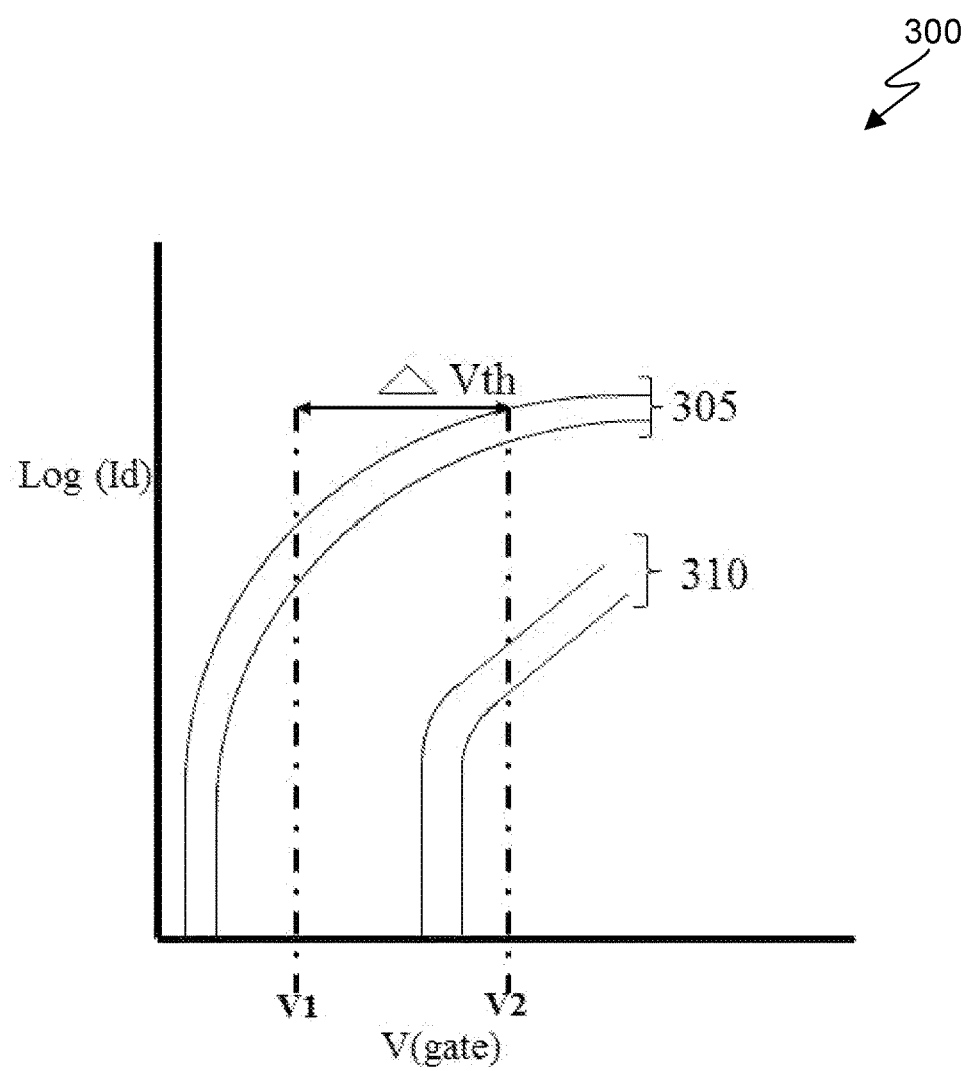
FIG. 3 is a plot of log ($I_d$) as a function of the voltage of the gate in NMOS FETs.

FIG. 3 depicts the relationship log ($I_d$) as a function of the voltage of the gate in NMOS FETs, in accordance with an embodiment of the present invention.

Plot 300 is a graphical representation of the log ($I_d$) as a function of the voltage of the gate in NMOS FETs. Curve 305 represents a NMOS device which did not trap electrons using the setup in FIG. 2. Curve 310 represents a device which trapped electrons using the setup in FIG. 2. Both curve 305 and curve 310 have the same general shape in that as the voltage of the gate region increases along the V(gate) axis, the electrical current ($I_d$) (or log ($I_d$)) of the drain region increases non-linearly. The trapped electrons cause an increase in $V_{th}$, as exhibited by the shifted position of curve 310 in comparison to curve 305. The dotted vertical lines that intersect with curve 305 and curve 310 at respective voltage points correspond to $V_{th}$ of a NMOS FET. From these intersections, $\Delta V_{th}$ is computed as the difference between $V_{th}$ of curve 310 and $V_{th}$ of curve 305. V2 is $V_{th}$ of curve 310 while V1 is $V_{th}$ of curve 305, where V2 is greater than V1 and thus $\Delta V_{th} > 0.0$ V. Thus, these curves demonstrate that trapping electrons by the setup in FIG. 2 is able to increase voltages of a NMOS FET.

Figure 4:
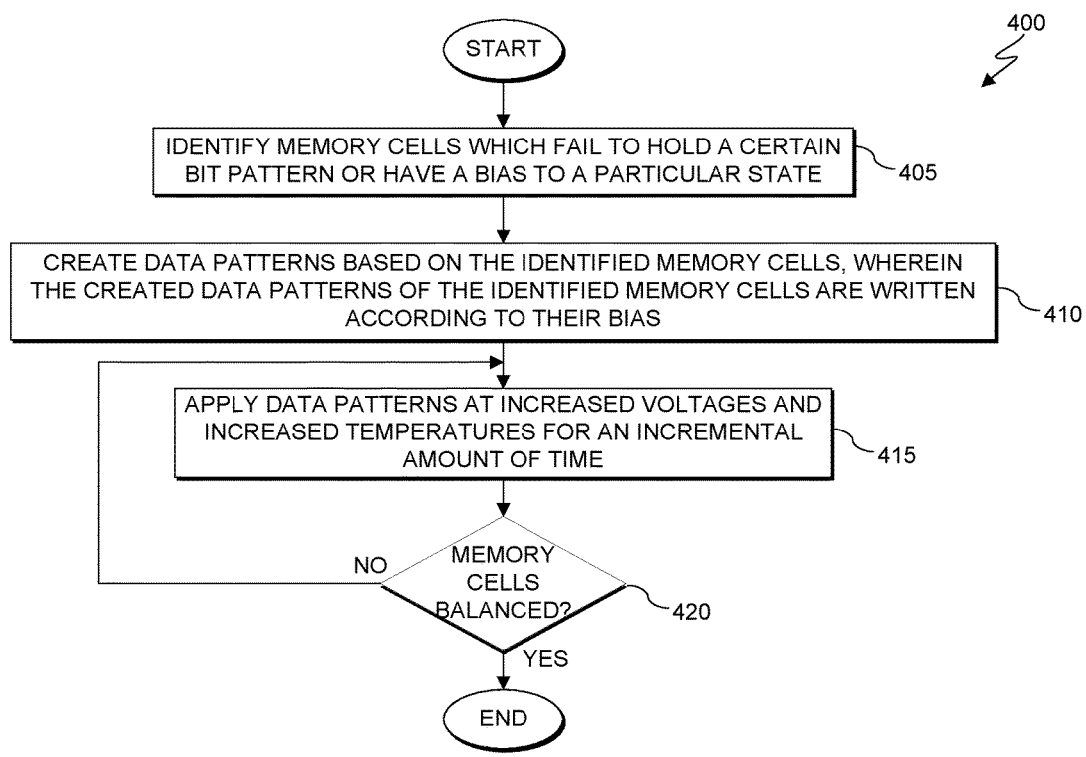
FIG. 4 is a flowchart depicting the operational steps to enable voltages of a SRAM cell to shift, in accordance with an embodiment of the present invention.

FIG. 4 is a flowchart depicting the operational steps to enable voltages of the SRAM cell to shift, in accordance with an embodiment of the present invention.

Flowchart 400 is a method which can improve the margin of the SRAM circuit by induction of $V_{th}$ shifts in selected cells. Circuit controls are equipment used to examine and modify the properties of a circuit contain an array of SRAM cells, as described in greater detail with regard to FIGS. 5A and 5B. Such equipment may include advanced semiconductor test equipment including probers, function generators, power supplies, etc.

In step 405, circuit controls identify cells which fail to hold a certain bit pattern or have a bias to a particular state (i.e., favoring the "one" state over the "zero" state or vice versa). In an exemplary embodiment, some SRAM cells have a weak or negative margin due to a voltage threshold ($V_{th}$) mismatch in a specific SRAM cell. A bias towards a particular state may be characterized under a fixed voltage bias scheme (i.e., the observed voltage biases are uniform among the bits) or a partial bias voltage scheme (i.e., observed voltage biases are variable among the bits). An array, which contains SRAM cells, is examined for weak margin SRAM cells via power cycling. In this exemplary embodiment, the state of the SRAM cells are read out after writing a bit pattern into the memory array by using the test instrumentation. SRAM cells, which do not hold the voltage threshold for a "zero" state bit or "one" state bit, are identified. Reading out the state of the SRAM cells after writing a bit pattern into the memory array by using the test instrumentation (e.g., a prober) is an example of empirically testing SRAM cells. As opposed to applying computer simulations or logic operations on the SRAM cells, the state of the SRAM cells are experimentally determined/observed. Thus, the state of the SRAM cells have been empirically tested. Upon determining the state of the SRAM cell, it can be further determined whether the SRAM cell fails to hold a certain bit pattern or has a bias towards a particular state. Without departing from the scope of the claims of this disclosure, other types of equipment, systems, or methods may be implemented in order to: (i) empirically test/determine the state of a SRAM cell, and (ii) whether the SRAM cell fails to hold certain bit pattern or has a bias towards a particular state.

In step 410, circuit controls create patterns, wherein the created data patterns of the identified cells are written according to [the identified memory cell] bias. In this embodiment, the created data patterns of the identified cells are also written according to failing state and non-failing "balanced" [memory] cells are set alternately to both "zero" and "one" states for an equal (balanced) amount of time. In some embodiments, the circuit controls write a complementary state to the identified state. The bi-stable latching circuitry, as described above, of a SRAM cell contains a bit. In an exemplary embodiment, within the bi-stable latching circuitry (BSLC), there are two NMOS FETs and two PMOS FETs organized as two sets of CMOS devices—the left CMOS set of devices and right CMOS set of devices. Furthermore, the left CMOS set of devices contain a single NMOS FET unit and a single PMOS unit and the right CMOS set of devices contain another single NMOS FET unit and another single PMOS unit. (See FIG. 5B for an example of BSLC.) By definition, the complement to the "zero" state is the "one" state and vice-versa. The state of the bit dictates the location of the bit within BSLC. For example, if a bit in the "zero state" resides in the right CMOS set devices of BSLC, then the "one" state resides in the left CMOS set of devices. The circuit controls write the complementary state into the BSLC of the identified SRAM cells which fail to hold the voltage threshold and/or fail to hold a bit pattern for an identified state (see step 405). For example, the circuit controls write the "one" state into the BSLC of the SRAM cells that have been identified as cells which fail to hold the voltage threshold for the "zero" state. In another example, the circuit controls write the "zero" state into the BSLC of the SRAM cells that have been identified as cells which fail to hold the voltage threshold for the "one" state.

In step 415, circuit controls applies data patterns at increased voltage and increased temperatures for an incremental amount of time. The application of voltages and/or increased temperatures enable the trapping of electrons in the gate of a NMOS FET or a PMOS FET. Increasing the voltages and/or temperatures stress the identified cells which fail to hold a bit pattern (see step 405). The stressing (e.g., modifying voltages and temperatures over a period of time) may occur: (i) evenly across all identified cells (e.g., voltages are uniformly increased across all identified cells); or (ii) unevenly across all identified calls (e.g., voltages are not uniformly increased across identified cells). In an exemplary embodiment, the increase in $V_{CS}$, as described with respect to step 415, increases the flow electrons and induces a shift in the $V_{th}$ of a NMOS FET, wherein the NMOS FET is a component of a SRAM cell identified as having a poor margin. This is a targeted shift directed at the NMOS FET, which increases the margin of the SRAM cell. Thus, increasing the margin of cells identified as having a poor or negative margins, improves the margin of these identified cells. The NMOS FET is a component of the SRAM cell and this SRAM cell, among the other SRAM cells, are components of the array. By virtue of shifting the $V_{th}$ of a simpler component, the more complex components up to the array experience an increased $V_{th}$. The hafnium (IV) oxide structure within the NMOS FET, as described with respect to FIG. 1, contains defects in the crystal structure. One such defect is an oxygen vacancy, wherein the oxygen vacancy is a site which previously held an oxygen atom bound to hafnium atoms. In conjunction with structures such as IL 215 and Si 220 (as depicted in FIG. 2), the oxygen vacancy acts as electron trap 210 (as depicted in FIG. 2). Furthermore, the oxygen vacancy readily and easily traps electrons. The gate of the NMOS FET is now biased positively (i.e., electrons are flowing towards the gate of the NMOS FET). This is an example of positive BTI (PBTI). The application of voltages and/or increased temperatures may also induce the trapping of electrons in the gate of a PMOS FET.

More specifically in step 415, circuit controls bias a singly selected NMOS FET and a singly selected PMOS FET. The identified SRAM cell contains a bit in the "zero" state. In an exemplary embodiment, a controller supply voltage ($V_{CS}$) originates from a voltage supply pin, wherein $V_{CS}$ is the voltage inputted into a SRAM cell. In other embodiments, $V_{DD}$ is another voltage originating from a voltage supply pin. In one example, by raising the $V_{CS}$ in the identified SRAM cells, which each contain a bit in the "zero" state, and maintaining the raised $V_{CS}$ value for a period time, a single PMOS FET unit, of the left CMOS set of devices, and a single NMOS FET unit, of the right CMOS set of devices, are selectively biased within the identified SRAM cell. In this example, the bit in the "zero" state resides in the right CMOS set of devices while receiving the raised $V_{CS}$. The left CMOS set of devices, which is at 0.0 V, is the location where the complementary "one" state would reside. Through the selective biasing, as described above, the bit, which is residing in the right CMOS set of devices, becomes skewed towards the left CMOS set of devices. By virtue of becoming skewed towards the left CMOS set of devices, the identified SRAM cell is becoming skewed towards the complementary bit. Biasing can be achieved over a predetermined time or by the stressing described in step 420.

In step 420, circuit control determine if a biased memory cell is balanced. The identified cells have been biased (see step 415). Upon identifying the unbalanced cells, biasing the unbalanced cells, and stressing the identified and biased the unbalanced cells, some of these cells may hold a bit pattern or may not hold a bit pattern. Circuit controls determine which identified and biased cells are able to hold the bit pattern and thus, balanced. In this embodiment, circuit controls determine whether the identified cells are balanced by identifying voltages corresponding with a bit within the unbalanced memory cells which have been biased (as described in step 415). By applying power cycling techniques, the bit(s), within the unbalanced memory cells which have been biased, are further interrogated to ascertain if bias stressing the identified memory cell removed the imbalance of one state being favored over the complement (or vice versa). If a biased cell is balanced (i.e., the imbalance has been removed), then the circuit controls cease bias stressing for that cell (i.e., "Yes" branch, where processing ends). If the biased cell is not balanced (i.e., the imbalance has not been removed), then the circuit controls identify memory cells which fail to hold a certain bit pattern or have a bias to a particular set (i.e., "No" branch/resuming the flowchart at step 415).

Figure 5A:
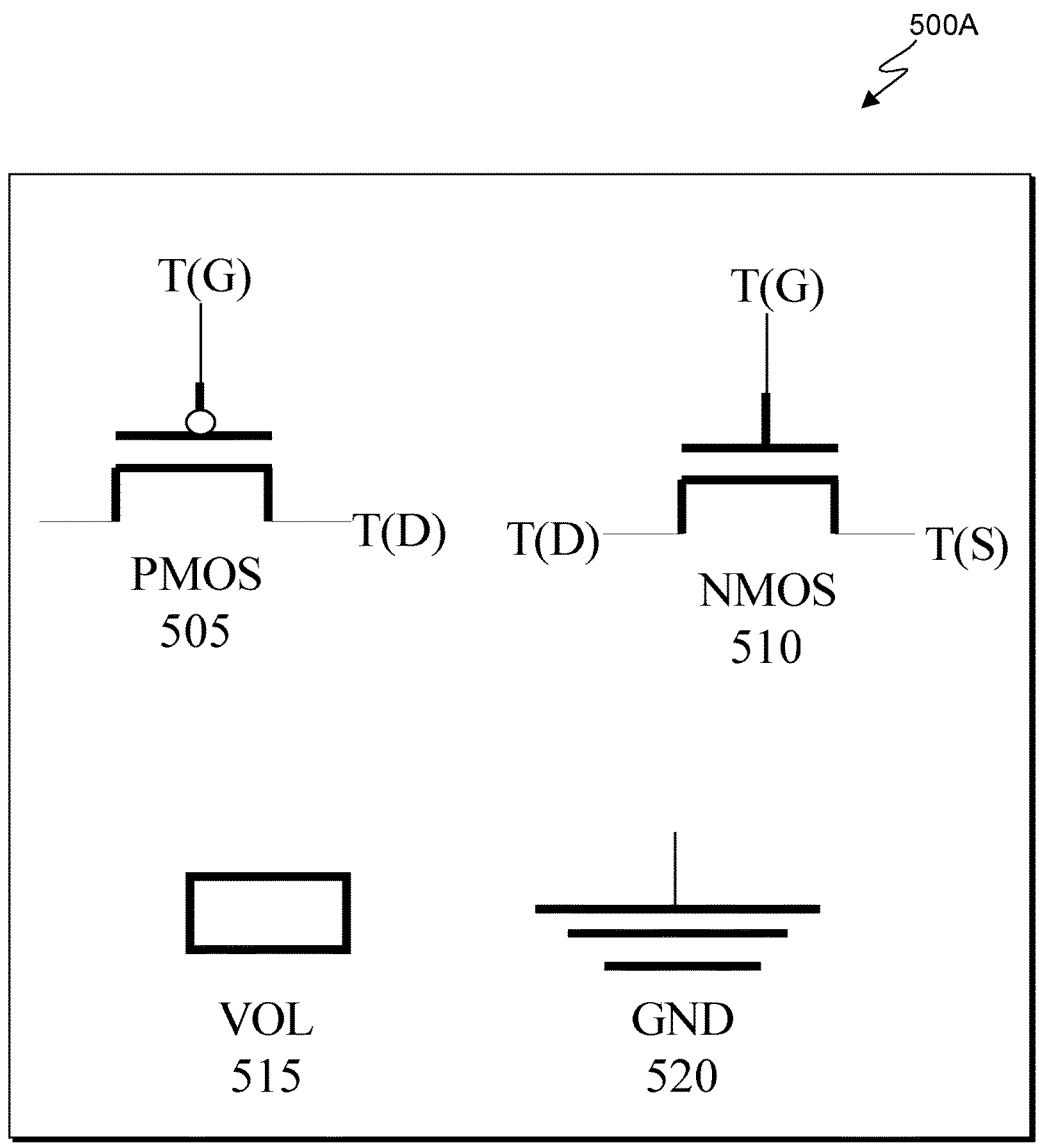
FIG. 5A is a diagram of the electronic components that are necessary to enable the voltages of a SRAM cell to shift, as described in the flowchart in FIG. 4, in accordance with an embodiment of the present invention.

FIG. 5A is a diagram of the electronic components that are necessary to enable the voltages of a SRAM cell to shift, as described in the flowchart in FIG. 4, in accordance with an embodiment of the present invention.

Additional types of electronic component devices may be used without departing from the scope of the invention as recited. The electronic components, depicted in FIG. 5A, are arranged in particular configurations in conjunction with other wires, voltage sources, data sources, etc., in order to enable the voltages of a SRAM cell to shift, in accordance with an embodiment of the present invention array core during a write operation. The details pertaining to the configured arrangements of these electronic components will be discussed in more detail with respect to FIG. 5B. Components environment 500A depicts the following electronic components: an n-channel type metal oxide semiconductor; a p-channel type metal oxide semiconductor; a voltage supply pin; and a grounding device.

PMOS 505 is a type of metal-oxide semiconductor field-effect transistor (MOSFET) used for amplifying and switch electronic signals. More specifically, PMOS 505 uses holes (as opposed to electrons) for conduction. PMOS 505 is a device containing three terminals—T(G), T(S), and T(D). These terminals may be connected to data inputs, other wires, other electronic components, and/or devices. In this embodiment, the gate terminal is T(G); the source terminal is T(S); and the drain terminal is T(D). Drain-to-source current flows (via a conducting channel) connects the source terminal to the drain terminal. The conductivity is varied by the electric field that is produced when a voltage is applied between the gate terminal and the drain terminal. Hence, the current flowing between T(S) and T(D) is controlled by the voltage applied between T(G) and T(D). T(G) is attached to a polysilicon surface. T(G) and T(D) are connected to a hafnium(IV) oxide surface using heavily doped p-type material (i.e., holes/electron deficient carriers to facilitate conduction). Electric currents leave the source terminal and gate terminal and arrive into the drain terminal.

NMOS 510 is an n-type of metal-oxide semiconductor field-effect transistor (NMOS FET) used for amplifying and switch electronic signals. More specifically, NMOS 510 uses electrons (as opposed to holes) for conduction. NMOS 510 is a device containing three terminals—T(G), T(S), and T(D). These terminals may be connected to data inputs, other wires, other electronic components, and/or devices. T(G) is the gate terminal; T(S) is the source terminal; and T(D) is the drain terminal. Drain-to-source current flows (via a conducting channel) connects T(S) to T(D). The conductivity is varied by the electric field that is produced when a voltage is applied between the T(G) and the T(S). Hence, the current flowing between T(D) and T(S) is controlled by the voltage applied between T(G) and T(S). T(G) is attached to a polysilicon surface. T(G) and T(D) are connected to a hafnium(IV) oxide surface using heavily doped n-type material (i.e., electrons/electron rich carriers to facilitate conduction). Electric currents leave the gate terminal and the drain terminal and arrive into the source terminal.

VOL 515 is a voltage power supply pin directed towards FETs. In other words, VOL 125 provides voltage to FETs. In flowchart 400, VOL 515 provides $V_{CS}$ to right CMOS set.

GND 520 is a device which ground voltages. Signal grounds serve as return paths for signals and power within equipment and on signal interconnections between equipment. Voltage is the difference in electric potential energy between two points per unit of electric charge. Voltage can only be measured in terms of differences so in order to measure a given point, a reference point must be selected to measure against. These ground voltages are treated as the reference points, which are given a voltage of 0.0 Volts.

Figure 5B:
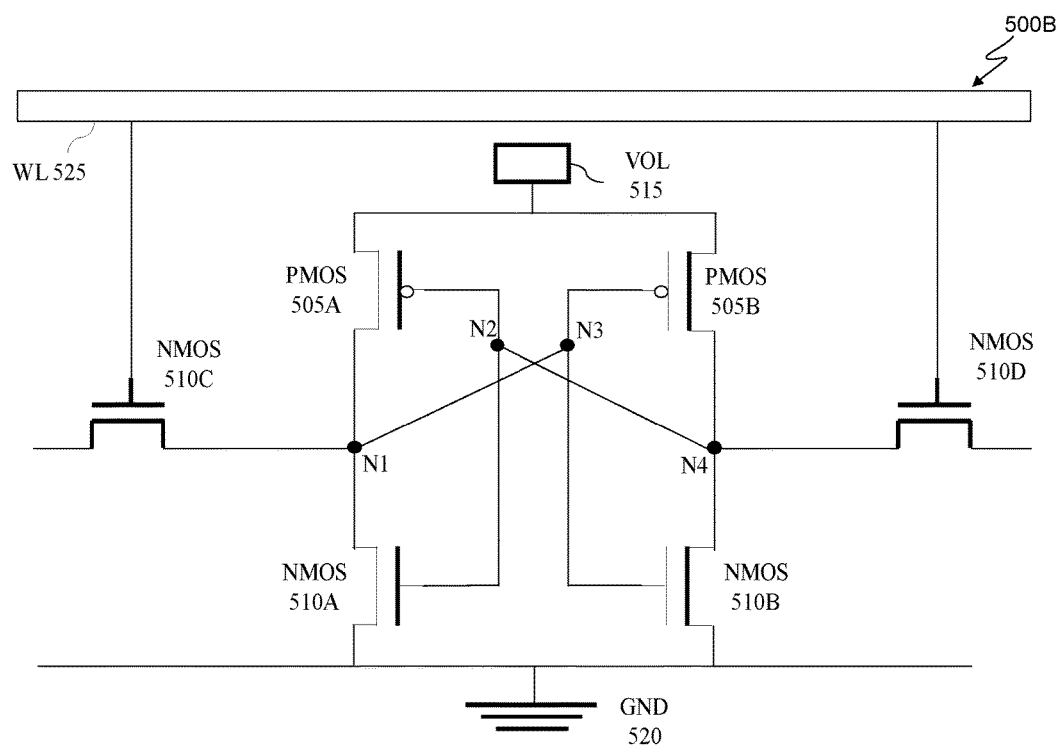
FIG. 5B is a diagram of a CMOS containing circuit which enables the voltages of a SRAM cell to shift, as described in the flowchart in FIG. 4, in accordance with an embodiment of the present invention.

FIG. 5B is a diagram of a CMOS containing circuit which enables the voltages of a SRAM cell to shift, in accordance with an embodiment of the present invention. FIG. 5B provides only an illustration of implementation and does not imply any limitations with regard to the environments in which different embodiments may be implemented.

Modifications to circuit 500B may be made by those skilled in the art without departing from the scope of the invention as recited by the claims. Circuit 500B, may be, for example, a bi-stable latching circuit (BSLC) found in a SRAM cell containing one or more component devices of FIG. 5A.

Wires are utilized to connect the components within circuit 500B; transfer data; conduct electrical current; and perform other functions. Not all of the wires and components are illustrated. Read word lines and read bit lines are not depicted however this does not exclude SRAM systems which contain read word lines and read bit lines from the scope of the invention as recited by the claims. Nodes N1, N2, N3, and N4 are triple points of connection, wherein the triple point connects three components together at a common point via at least one wire.

Circuit 500B may be referred to as a bit cell or memory cell. In this embodiment, circuit 500B is a 6 Transistor SRAM (6T-SRAM) cell. Circuit 500B contains/employs at least the following structures: (i) access transistors (NMOS 510C and 510D); (ii) bi-stable flip-flop (PMOS 505A, PMOS 505B, NMOS 510A, and NMOS 510B); and (iii) word lines (WL 525). Within an array (or array core), there are multiple units of the SRAM cell which are arranged in a two-dimensional manner.

The notation—"PMOS 505A" and "PMOS 505B"—is used to distinguish between the two units of PMOS 505 (as described above with respect to FIG. 5A) in circuit 500B. The notation—"NMOS 510A", "NMOS 510B", "NMOS 510C", and "NMOS 510D"—is used to distinguish between the four units of NMOS 510 (as described above with respect to FIG. 5A) in circuit 500B.

The access transistors—NMOS 510C and NMOS 510D—are used as intermediaries to connect the bi-stable flip-flop to WL 525. The gate terminal and the source terminal, as contained within NMOS 510C and NMOS 510D, are used to connect to word lines (e.g., WL 525), and bi-stable flip-flop, respectively. The bi-stable flip-flop connects to NMOS 510C and NMOS 510D at N1 and N4, respectively. In turn, WL 525 is used to select a single SRAM cell unit among multiple SRAM cell units.

The bi-stable flip-flop is an actual structure (i.e., active storage site of a SRAM cell) which stores a bit, wherein the bit is either in the "zero" state or "one" state. The "zero" state and the "one" state are complements of each other. Bi-stable flip-flop contains two NMOS FETs—NMOS 510A and NMOS 510B—and two PMOS FETs—PMOS 505A and PMOS 505B. These four transistors are arranged to make a complementary metal oxide semiconductor (CMOS) system (i.e., a circuit design using complementary and symmetrical pairs of NMOS and PMOS type transistors), which invokes two nodes in order to store a bit in a complementary fashion. Nodes N1 and N2 are associated with the left CMOS set while nodes N3 and N4 are associated with the right CMOS set. Furthermore, N1 is the complementary position to N4 while N2 is the complementary position to N3. N1 and N2 hold opposite values of the voltage. Similarly, N3 and N4 hold opposite values of the voltage. N1 is connected to N3 and N2 is connected to N4. For example, if N1=$V_{cs}$ then N2=GND (i.e., the ground voltage). In an exemplary embodiment consistent with flowchart 400 from above, the right CMOS set is PMOS 505B and NMOS 510B; and the left CMOS set is PMOS 505A and NMOS 510B. For example, if the stored bit is in the "zero" state, then the bit is stored in node N1; and if the stored bit is in the "one" state, then the bit is stored in node N4.

In an exemplary embodiment consistent with flowchart 400 from above, VOL 515 provides $V_{CS}$ to N4 of the right CMOS set and GND 520 grounds the voltage of circuit 500B. Selectively biasing both NMOS 510A, of the left CMOS set in the bi-stable flip-flop, and PMOS 505B, of the right CMOS set in the bi-stable flip-flop induces a $V_{th}$ in one of the NMOS FETs. Furthermore, the stored bit residing in the right CMOS, which is in the "zero" state, skews the SRAM cell towards the complement. The complement to the stored bit is associated with node N1. Node N1, which has a voltage of 0.0 V, accepts the stored bit from N4 through N2 and thus the stored bit switches from the "zero" state to the "one" state. In another exemplary embodiment of skewing a stored bit towards the complement, node N4 accepts the stored bit from N1 through N3.

What is claimed is:
1. A method for alleviating cell bias, comprising:
empirically testing for a digital state of a plurality of cells within an array of static random-access memory (SRAM) to determine unbalanced cell bias, wherein the SRAM contains a plurality of field-effect transistors (FETs), and wherein the plurality of FETs comprise an inorganic insulator;
determining which cells, within the array of SRAM, fail to hold a certain bit pattern, wherein determining cells within the array of SRAM which fail to hold the certain bit pattern, comprises:
determining that the cells have a fixed bias for the digital state; and
determining that the cells have a partial bias for the digital state;
responsive to determining which cells within the array of SRAM fail to hold a certain bit pattern, switching a state of a bit, wherein the bit resides in a negative margin cell among the plurality of cells within the array of SRAM, wherein the bit is either in a zero state or a one state, and the negative margin cell fails to hold the certain bit pattern;
responsive to switching the state of the bit, trapping a plurality of charge carriers in the inorganic insulator;
responsive to trapping the plurality of charge carriers in the inorganic insulator, balancing a cell bias of the negative margin cell to an improved margin, wherein balancing a cell bias of the negative margin cell to an improved margin, comprises:
identifying negative margin cells and positive margin cells among the plurality of cells within the array of SRAM utilizing power cycling, wherein:
the negative margin cells are cells identified as failing to hold a certain bit pattern,
the positive margin cells are identified as not failing to hold a certain bit pattern, wherein
the certain bit pattern is an associated threshold for a one state and another associated threshold for a zero state,
targeting a voltage shift for the negative margin cells,
responsive to targeting the voltage shift for the negative margin cells, modifying an electric field locally to in turn increase a voltage of a FET within the array of SRAM,
utilizing an even time bias for the zero state and the one state for balanced cells,
utilizing an uneven time bias for the zero state and the one state for unbalanced cells,
noting that a bias of the identified negative margin cell favors the zero state over the one state, and
noting that a bias of the identified negative margin cell favors the one state over the zero state;
responsive to balancing the cell bias of negative margin cell, ceasing bias stressing of the negative margin cell and maintaining balance stressing of the negative margin cell;
writing a state into a cell corresponding to cells determined to have the fixed bias or the partial bias for the digital state by:
increasing a supply voltage with a balancing state in each cell among the determined cells within the array of SRAM which fail to hold the certain bit pattern; and
increasing temperature with the balancing state in each cell within the array of SRAM which fail to hold the certain bit pattern;
responsive to writing the state into the cell corresponding to the cell determined to have the fixed bias or the partial bias for the digital state, implement selective biasing where:
an upper field effect transistor of a first set of complementary metal oxide semiconductor (CMOS) devices is biased, and a lower field effect transistor of a second set of CMOS devices is biased; and skewing a bit within a first node to a second node, wherein the second node is contained within a corresponding bias to the first node.

* * * * *